United States Patent
Tanemura

(10) Patent No.: US 8,420,498 B2
(45) Date of Patent: Apr. 16, 2013

(54) ALIGNMENT METHOD OF CHIPS

(75) Inventor: Yukihiro Tanemura, Chitose (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 302 days.

(21) Appl. No.: 12/413,809

(22) Filed: Mar. 30, 2009

(65) Prior Publication Data

US 2009/0269862 A1    Oct. 29, 2009

(30) Foreign Application Priority Data

Apr. 24, 2008    (JP) .................................. 2008-114377

(51) Int. Cl.
*H01L 21/66*    (2006.01)
*H01L 23/544*    (2006.01)

(52) U.S. Cl.
USPC .......... 438/401; 438/16; 438/7; 257/E21.521; 257/E21.525; 257/E21.524; 257/E21.528; 257/E21.53

(58) Field of Classification Search ......... 438/FOR. 495
See application file for complete search history.

(56) References Cited

U.S. PATENT DOCUMENTS 7,692,319 B2 *    4/2010    Sogawa ........................ 257/797

FOREIGN PATENT DOCUMENTS

JP    2299251    *    2/1990
JP    2001-035924    *    2/2001

* cited by examiner

*Primary Examiner* — Julio J Maldonado
*Assistant Examiner* — Mohammad Choudhry
(74) *Attorney, Agent, or Firm* — IPUSA, PLLC

(57) ABSTRACT

An alignment method of chips that are formed on a surface of a semiconductor wafer with alignment marks corresponding to the chips includes the steps of irradiating an alignment mark corresponding to a predetermined alignment chip in a predetermined area including the chips with a laser light; detecting reflected waves from the alignment mark of the predetermined alignment chip to obtain a position of the alignment mark of the predetermined alignment chip; irradiating an alignment mark of an alternative chip different from the predetermined alignment chip with the laser light in case of not being able to obtain the position of the alignment mark of the predetermined alignment chip; obtaining a position of the alignment mark of the alternative chip by detecting the reflected waves from the alignment mark of the alternative chip; and aligning the chips in the predetermined area based on positions of alignment marks including the position of the alignment mark of the alternative chip.

13 Claims, 9 Drawing Sheets

LASER
IRRADIATION    23  21

LEFT UPPER EDGE PART OF WAFER

RIGHT UPPER EDGE PART OF WAFER 11c, 50c, 13c, 15c, CENTER PART OF WAFER, 17c 11d, 13d, 50d, LEFT LOWER PART OF WAFER, 17d

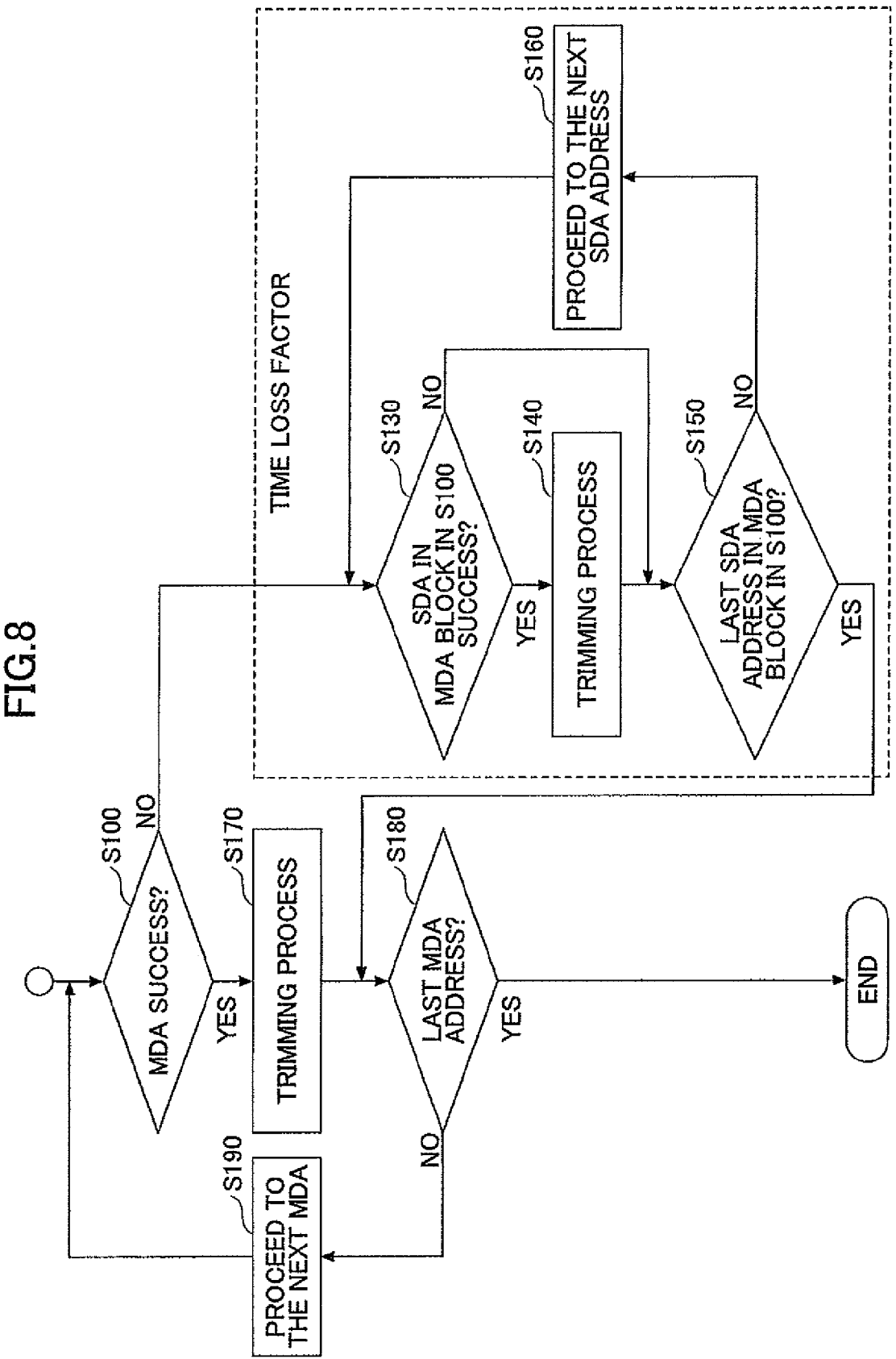

ALIGNMENT METHOD OF CHIPS

CROSS-REFERENCE TO RELATED APPLICATIONS

This patent application is based upon and claims the benefit of priority of Japanese Patent Application No. 2008-114377 filed on Apr. 24, 2008, the entire contents of which are incorporated herein by reference.

BACKGROUND OF THE INVENTION

1. Field of the Invention

The present invention generally relates to alignment methods of chips. More specifically, the present invention relates to an alignment method of chips utilizing an alignment mark corresponding to a plurality of chips formed on a semiconductor wafer.

2. Description of the Related Art

Conventionally, in a case where a plurality of chips (dies) needed to undergo laser trimming are formed on a semiconductor wafer, techniques of aligning the chip provided with an alignment mark including materials such as metal with a laser light is known. According to the techniques, the alignment of the chip is performed by irradiating the alignment mark with the laser light, by detecting a peak of reflected waves from the alignment mark and by finding a position of the chip. In such alignment methods for trimming, in terms of a quick alignment, a multi-die alignment is performed. In the multi-die alignment, a plurality of chips in a certain area which can be trimmed continuously only with the laser moving are aligned in a block. More specifically, the multi-die alignment aligns the entire predetermined area once, by irradiating the alignment marks of a few chips at the corner of the predetermined area with the laser light and by detecting the reflected waves. This allows all of the chips in the predetermined area to be aligned in one block, which enables a manufacturer to perform the alignment in a short time. Also, when the multi-die alignment is performed regarding all of the dies in the predetermined areas in case proper reflected waves are not detected by irradiating the chips around the corner in the predetermined area with the laser, a process of changing into a single-die alignment is performed. In the single-die alignment, each of the chips (dies) is individually aligned so that the alignment is performed in an ensured manner.

Moreover, as a technique utilizing the multi-die alignments, in a case where a semiconductor chip formed on a surface of a substrate has a fuse for adjusting resistance, a first alignment mark including the same material as the fuse and a second alignment mark including material with a different reflectance from the first material, a trimming method with the alignment marks is disclosed in Japanese patent publication 2001-35924. In the trimming method, the trimming is performed by aligning the second alignment marks in a case when the first alignment with the first alignment marks fails.

In the trimming method disclosed in the Japanese patent publication 2001-35924r the first alignment marks including poly silicon, the same material as the fuses, are formed by the same mask, which allows the manufacturer to produce semiconductor devices without relative displacements and to make the alignment marks highly reliable. When the alignment with the first alignment marks fails because of insufficient reflectance, the second alignment is performed with the second alignment marks including aluminum. According to this method, both advantages of the poly silicon and the aluminum are provided and the number of required processes is effectively reduced, keeping a decent success rate of the alignment.

However, according to the above conventional technique, when the multi-die alignment fails and the process for changing into the single-die alignment is performed, if the chips in the predetermined area are minute, for example, in a case where hundreds of the chips are included in the predetermined area, the single-die alignment takes hundreds of times longer than does the multi-die alignment to succeed, which causes a problem of time loss. Furthermore, in recent years, the size of the chips processed by the laser trimming tends to become smaller and the number of the chips processed by the laser trimming in the same area tends to increase. In view of this, the time loss in changing into the single-die alignment becomes a problem which cannot be overlooked.

In addition, according to the alignment method disclosed in the Japanese patent publication 2001-35924, it is necessary to produce the semiconductor devices with two kinds of alignment marks including different materials, which causes a problem because the semiconductor fabrication process is made complicated. Moreover, because alternatives to the first alignment marks are only the second alignment marks in the same chips, for example, in case of problems such as a poor reflecting power of the aluminum marks, a break of patterns and an inclination of the substrate in a rough alignment in a previous stage, using the second alignment marks has the same problems as using the first alignment marks and the alignment fails. In particular, if the alignment fails with the second alignment marks, recovering the alignment is impossible and the alignment completely ends in failure.

SUMMARY OF THE INVENTION

Accordingly, embodiments of the present invention may provide a novel and useful alignment method of chips solving one or more of the problems discussed above.

More specifically, the embodiments of the present invention may provide an alignment method of chips whereby multi-die alignment can be certainly performed only by changing an alignment process without changing any fabrication processes for a semiconductor wafer.

One aspect of the present invention may be to provide an alignment method of chips that are formed on a surface of a semiconductor wafer with alignment marks corresponding to the chips, the method including the steps of:

irradiating an alignment mark corresponding to a predetermined alignment chip in a predetermined area including chips with a laser light;

detecting reflected waves from the alignment mark of the predetermined alignment chip to obtain a position of the alignment mark of the predetermined alignment chip;

irradiating an alignment mark of an alternative chip different from the predetermined alignment chip with the laser light in case of not being able to obtain the position of the alignment mark of the predetermined alignment chip;

obtaining a position of the alignment mark of the alternative chip by detecting the reflected waves from the alignment mark of the alternative chip; and aligning the chips in the predetermined area based on positions of alignment marks including the position of the alignment mark of the alternative chip.

Additional objects and advantages of the embodiments are set forth in part in the description which follows, and in part will become obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 8 is a view showing a conventional process flow of an alignment method of chips.

DETAILED DESCRIPTION OF THE PREFERRED EMBODIMENTS

A description is given below, with reference to FIG. 1 through FIG. 7 of embodiments of the present invention.

Figure 1:
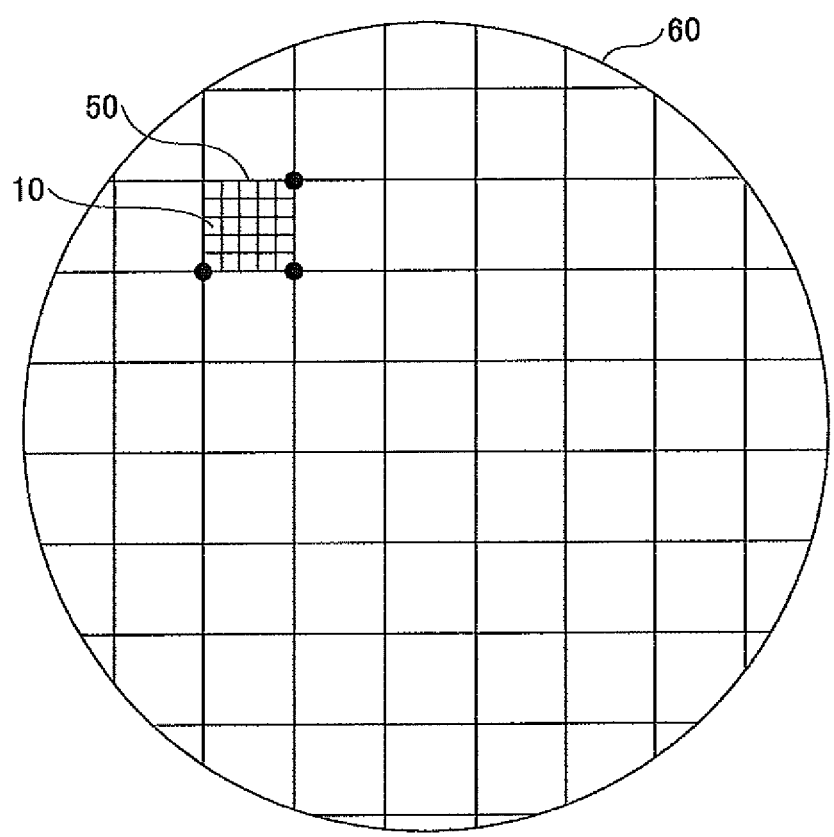
FIG. 1 is a view showing a semiconductor wafer to be applied by an embodiment of the present invention.

FIG. 1 is a view showing an example of a semiconductor wafer to be applied by an embodiment of the present invention, specifically, the alignment method of chips. A plurality of chips 10 are formed on the semiconductor wafer 60. A predetermined alignment area 50 forms a group of the plurality of chips 10.

Each of the chips 10 includes a fuse for cutting (not shown in FIG. 1). The chip 10 has a configuration which allows for an adjustment for resistance of an analog circuit, a bit saving for a memory and so on. Cutting the fuse is performed by a laser-light-irradiating apparatus which irradiates the fuse with the laser light to cut the fuse such as a laser-trimming apparatus, a laser trimmer, a bit-saving apparatus, a laser-saving apparatus, a memory-repair system and so on. Since these apparatuses use the laser light for processing, it is preferable to also use the laser light for the alignment of the chip 10. Accordingly, an alignment mark formed out of a material capable of reflecting the light such as metal is provided with each of the chips 10. The alignment is performed by irradiating the alignment mark with the laser light, by detecting the reflected waves and by finding the position of the chip 10. However, if each of the chips 10 is individually aligned, the entire alignment will need many individual alignments and take a long period to align the chips 10. Therefore, the predetermined area 50 including the plurality of chips 10 is aligned in one block.

The predetermined area 50 is set within a range of area where the laser can move by the above-mentioned apparatuses such as the trimming apparatus when a stage supporting the semiconductor wafer is fixed. For example, the predetermined alignment area 50 may include 20*20=400 chips 10 (1 cm*1 cm=1 cm$^2$ in size) or may be 2 cm*2 cm=4 cm$^2$ in size when the size of the chips 10 is 0.5 cm*0.5 cm. Accordingly, the predetermined alignment area 50 is decided by the size of the chips 10 and the movable area of the laser of the laser-light-irradiating apparatus. FIG. 1 shows the plurality of predetermined alignment areas 50 on the entire semiconductor wafer. However, the predetermined alignment areas 50 are virtually set divisions and just the plurality of chips 10 are formed without border lines on the actual semiconductor wafer 60.

When the plurality of chips 10 included in the predetermined area 50 are aligned in one block (it may be called "multi-die alignment" in the following), the alignment can be performed by assuming the predetermined alignment area 50 as a large chip. For example, among the four corners of the predetermined alignment area 50, the position of any corner (from 1 to 4 corners) can be detected and the position of the predetermined alignment area 50 can be found. The alignment of the semiconductor wafer 60 can be performed based on the predetermined alignment area 50. FIG. 1 shows an example of performing the multi-die alignment by detecting three positions of a right-upper corner, a right-lower corner and a left-lower corner of the predetermined alignment area 50.

Thus, the embodiment of the alignment method of the chips 10 is applied to the multi-die alignment for aligning the plurality of chips 10 included in the predetermined alignment area 50.

Figure 2A:
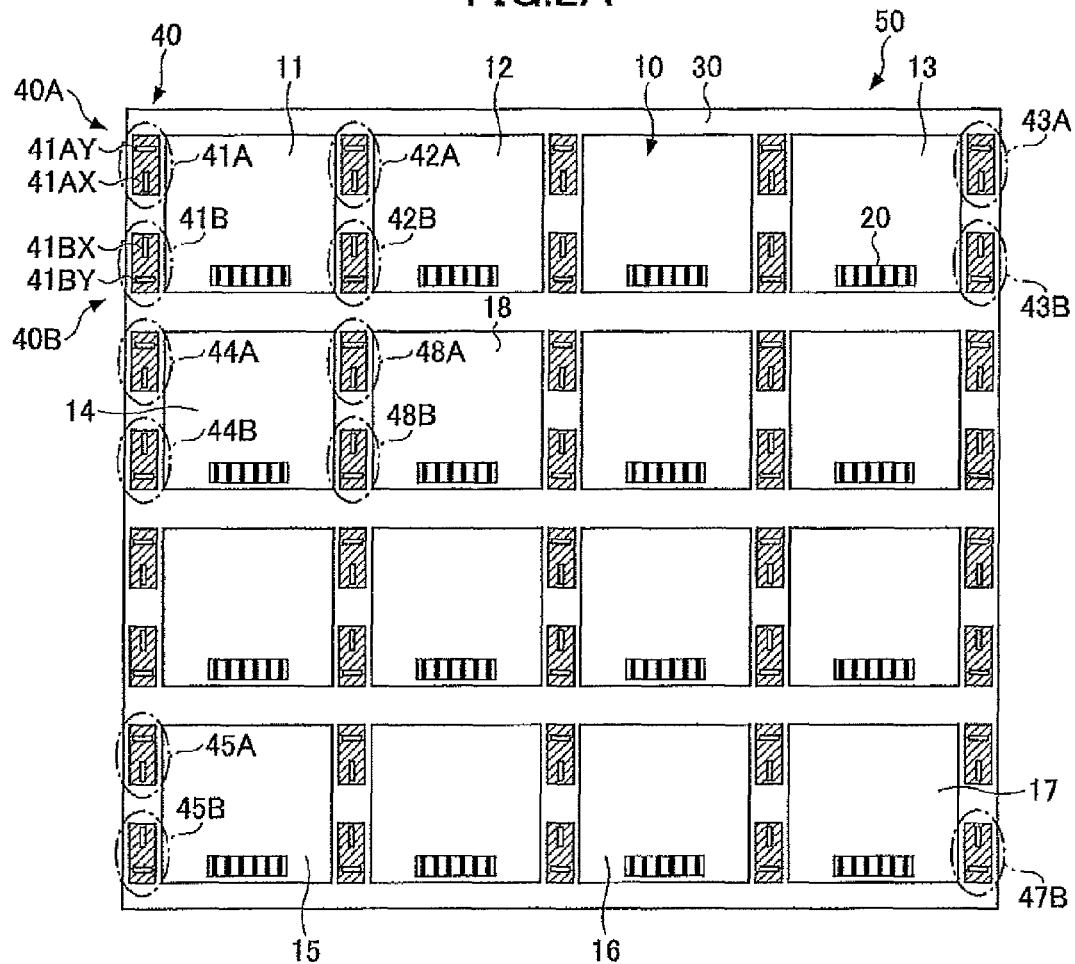
FIG. 2A is a view showing a predetermined alignment area.
Figure 2B:
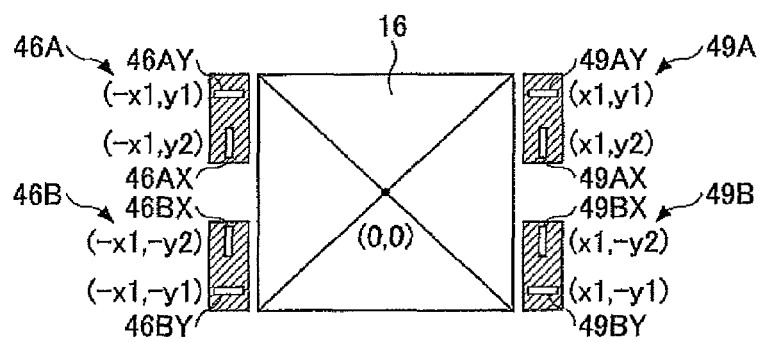
FIG. 2B is a view showing a position relationship between alignment marks corresponding to a chip.

Next, the embodiment of the alignment method of the chips 10 is explained with FIG. 2A and FIG. 2B. FIG. 2A and FIG. 2B are enlarged views showing examples of the predetermined alignment area 50 and chips 10 included in the predetermined area 50.

FIG. 2A is a view showing the example of the predetermined alignment area 50. In FIG. 2A, the predetermined alignment area 50 includes longitudinal 4*transverse 4=16 chips. Accordingly, in the example of FIG. 2A, the 16 chips 10 are aligned by the multi-die alignment. Also, each of the chips 10 has a fuse 20 for cutting. Trimming the resistance or repairing the memory can be performed by cutting the fuse 20 when it is necessary.

In FIG. 2A, scribe lines 30 are formed between the chips 10. After completed, each of the chips 10 becomes a finished product by cutting the scribe lines 30. Alignment marks 40 are provided with the scribe lines 30 not on the chips 10. This allows performing the alignment properly without narrowing an effective area of the chips 10. The alignment marks 40 are correspondently provided with each of the chips 10. In FIG. 2A, the alignment marks 40 are on the scribe lines 30 beside and between the chips 10. The alignment marks 40 are located at more outer part of the chips 10 than the fuses 20 that are in the chips 10. This allows trimming by cutting fuse 20 and a proper alignment of the chip 10 to the fuse 20. The alignment marks 40 include two kinds of alignment marks, upper alignment marks 40A and lower alignment marks 40B, which sandwich each of the chips 10 from both sides. The scribe lines 30 include one more line than the number of the chip rows longitudinally and transversely. The five longitudinal lines 30 and the five transverse lines 30 make up a lattice and a circumference of the predetermined alignment area 50 is enclosed with outer scribe lines 30.

When the alignment area 50 with such a configuration is aligned by the multi-die alignment, for example, it is preferable to align the alignment area 50 by selecting two points on a diagonal line or the three points including another point added to the two points on the diagonal line as chips for alignment (it may be called "alignment chips" in the following) and by using the alignment marks corresponding to the points. By doing this, multi-die alignment can be surely performed with a few alignment chips. In FIG. 2A, an example of the alignment is explained in the case where the left-upper corner chip 11, right-upper corner chip 13 and left-lower corner chip 15 are selected as the alignment chip 11, 13, 15 and the alignment is performed with the alignment marks 40 corresponding to the alignment chips 11, 13, 15.

The alignment marks 40 corresponding to the left-upper corner chip 11 include the upper alignment mark 41A and the lower alignment mark 41B on the left of the left-upper corner chip 11, and the upper alignment mark 42A and the lower alignment mark 42B on the right of the left-upper corner chip 11. It is thought that selecting the alignment mark 40 near the corner of the alignment area 50 improves accuracy of the alignment because a distance between the alignment marks 40 becomes longer and makes the alignment easier because the alignment marks 40 become nearer the actual circumference of the alignment area 50. Therefore, the upper alignment mark 41A nearest the left-upper corner of the alignment area 50 is selected as the alignment mark.

In the same way, regarding the right-upper corner chip 13, because the alignment mark 43A on the right-upper side of the right-upper corner chip 13 is nearest the right-upper corner of the alignment area 50, the alignment mark 43A is selected as the alignment mark 43A corresponding to the right-upper corner chip 13.

In the same way, regarding the left-lower corner chip 15, because the alignment mark 45B on the left-lower side of the left-lower corner chip 15 is nearest the left-lower corner of the alignment area 50, the alignment mark 45B is selected as the alignment mark 45B corresponding to the left-lower corner chip 15.

In this way, the chips 10 at the corner of the alignment area 50 are selected as the alignment chips 11, 13, 15. Moreover, among the alignment marks 40 corresponding to the alignment chips 11, 13, 15, the alignment marks 41A, 43A, 45B nearest the corners of the alignment area 50 are used for the multi-die alignment. This allows the chips 10 near the circumference to be applied as the alignment chips 11, 13, 15, which can enhance the accuracy of the alignment.

The individual alignment marks 40A, 40B include a pair of alignment marks for X-coordinate detection and for Y-coordinate detection. For example, concerning the alignment mark 41A, the upper part is the alignment mark for X-coordinate detection 41AY and the lower part is the alignment mark for Y-coordinate detection 41AX. Also, concerning the alignment mark 41B, the upper part is the alignment mark for X-coordinate detection 41BX and the lower part is the alignment mark for Y-coordinate detection 41BY. In FIG. 2A, because the alignment marks 41A, 41B are disposed alongside the chip 11 parallel to the Y-axis, the alignment marks 41AY, 41BY disposed on the outer side (the upside is the upper part, the downside is lower part) are used to detect the Y-coordinate and the alignment marks 41AX, 41DBX disposed on the inner side are used to detect the X-coordinate which does not have a difference in position between the alignment mark 41AX and the alignment mark 41B. Details of a detection method of the alignment marks 40 are described later.

When the multi-die alignment is performed, the selected alignment marks 41A, 43A, 45B are sequentially irradiated and scanned with the laser light and the positions of the alignment marks 41A, 43A, 45B are detected.

FIG. 2B is a view showing a positional relationship between the chip 16 and the alignment marks 46A, 46B, 49A, 49B corresponding to the chip 16. In FIG. 2B, when coordinates are set by assuming the center of the chip 16 as the origin point, each of the coordinates of the upper alignment mark 46A and the lower alignment mark 46B on the left of the chip 16, and the upper alignment mark 49A and the lower alignment mark 49B on the right of the chip 16 can be shown. More specifically, with regard to the left side of the chip 16, the upper alignment mark for detection of the Y-coordinate mark 46AY (−x1, y1), the upper alignment mark for detection of the X-coordinate mark 46AX (−x1, y2), the lower alignment mark for detection of the X-coordinate mark 46BX (−x1, −y2) and the lower alignment mark for detection of the Y-coordinate mark 46BY (−x1, −y1) are shown. Also, with regard to the right side of the chip 16, the upper alignment mark for detection of the Y-coordinate mark 49AY (x1, y1), the upper alignment mark for detection of the X-coordinate mark 49AX (x1, y2), the lower alignment mark for detection of the X-coordinate mark 49BX (x1, −y2) and the lower alignment mark for detection of the Y-coordinate mark 46BY (x1, −y1) are shown. In the end, the upper alignment mark 46A (−x1, y1) and the lower alignment mark 468 (−x1, −y1) on the left side, and the upper alignment mark 49A (x1, y1) and the lower alignment mark 49B (x1, −y1) on the right side are the coordinates of the alignment marks at the four corners. The coordinates at the four corners of the chip 16 can be detected by considering the distances and the coordinate differences between the chip 16 and the alignment marks at each of the corners.

By using the coordinate relationship as explained in FIG. 2B, the position of the alignment marks 41A, 43A, 45B in FIG. 2A., corresponding to the alignment chips 11, 13, 15 in the alignment area 50 can be found and the multi-die alignment can be performed based on the alignment marks 11, 13, 15. The multi-die alignment can be achieved by calculating the coordinates and an angle, by correcting the coordinates and the angle and by performing the alignment process.

In this case, when all the reflected waves from the alignment marks 41A, 43A, 45B of the alignment chips 11, 13, 15 by the irradiation with the laser light are detected, the multi-die alignment can be carried out with the detected three coordinates. However, when the reflected waves from the alignment marks 41A, 43A, 45B are not detected, the positions of the alignment marks 41A, 43A, 45B cannot be found. For example, the proper reflected waves cannot be detected when the reflectance of the metal of the alignment marks 41A, 43A, 45B are not enough, the patterns of the alignment marks 41A, 43A, 45B are out of shape and the alignment marks 41A, 43A, 45B are out of the irradiation range with the laser light because a θ alignment in the previous stage is not performed properly and the semiconductor wafer is tilted.

Under the circumstances, in the alignment method of the chips 10 of the embodiment of the present invention, when the reflected waves are not detected from the alignment marks 41A, 43A, 45B of the alignment chips 11, 13, 15, an alternative chip is selected instead of the alignment chips 11, 13, 15 and a process of irradiating the alignment mark corresponding to the alternative chip with the laser light is performed.

In FIG. 2A, the embodiment is explained by referring to a case where the reflected waves cannot be detected from the alignment mark 41A of the alignment chip 11. In FIG. 2A, when the reflected waves are not detected from the alignment mark 41A corresponding to the alignment chip 11, for example, the chip 12 on the right becomes the alternative chip and the alignment mark 42A corresponding to the alternative chip 12 is irradiated with the laser light and the reflected waves are detected. By doing this, the position of the alternative chip 12 can be detected when the reflected waves are detected from the alignment mark 42A corresponding to the alternative chip 12. Then, the multi-die alignment can be performed about the alignment area 50 in one block with the alignment marks 42A, 43A, 45B of the alternative chip 12 and the alignment chips 13, 15.

In the same way, the alternative chip of the alignment chip 11 may be the lower chip 14 of the alignment chip 11 and the position of the alternative chip 14 may be obtained by irradiating the alignment mark 44A corresponding to the alternative chip 14 with the laser light and by detecting the reflected waves.

In addition, the alternative chip may be the inner diagonally downward chip 18 to the alignment chip 11 and, in this case, the position of the alternative chip 18 may be obtained by detecting the position of the corresponding alignment mark 48A. Then, the plurality of chips 10 included in the alignment area 50 can be aligned by the multi-die alignment based on the alternative chip 18 and the alignment chips 13, 15.

In this way, even if the reflected waves cannot be detected from the alignment mark 41A of the predetermined alignment chip 11 selected first, the alignment can be performed by selecting the alternative chip from the surrounding chips 12, 14, 18, by detecting the reflected waves and the position of the alignment marks 42A, 44A, 48A and by combining the position of the alignment marks 43A, 45A of the other alignment chips 13, 15. By doing this, when the plurality of chips 10 in the predetermined alignment area 50 are aligned in one block, even if the reflected waves cannot be detected from the alignment marks 42A, 44A, 48A, the alignment mark of another chip 12, 14, 18 can be used as a substitute and the block alignment of the plurality of chips 10 can be performed in an ensured way.

When the position of the alignment mark 41A of the alignment chip 11 cannot be detected, the alternative chips 12, 14, 18 can be sequentially and repeatedly selected and irradiated with the laser light until the reflected waves can be detected. For example, instead of performing the process of selecting the alternative chip 12 only one time, if the reflected waves are not detected from the alternative chip 12, the detection of the alignment mark 44A of a second alternative chip 14 can be tried. Furthermore, if the second alternative chip 14 cannot be detected, the alignment mark 48A of a third alternative chip 18 can be tried. By doing this, even if the reflected waves cannot be detected from the alignment mark 42A of the alternative chip 12, the multi-die alignment can be surely performed by looking for other alternative chips 14, 18 and a prompt alignment can be certainly achieved. However, if the alternative chips 12, 14, 18 are near the center of the predetermined area 50, the accuracy of the alignment could be decreased. Therefore, for example, it would be possible to limit the times of selecting the alternative chips 12, 14, 18 or to determine the allowed range in advance.

Moreover, in FIG. 2A, an example of selecting the chip 10 adjacent to the alignment chip 11 as the alternative chips 12, 14, 18 is explained, but, for example, selecting the alternative chips by shifting to the inside by skipping one chip 10 or two chips 10 may be possible.

Also, in FIG. 2A, the example is explained by illustrating the case where the alignment chip 11 is at the corner of the alignment area 50 and the alternative chips 12, 14, 18 shift from the alignment chip 11 to the inside. However, if the alignment chip 11 is set a little inside, the process of shifting to the outside and selecting the alternative chips 12, 14, 18 from the outside can be performed.

Furthermore, in FIG. 2A, the example is explained by illustrating the case where the detection of the alignment marks 41 corresponding to the alignment chip 11 fails, but the example can be applied to the other alignment chips 13, 15 as well. In this case, an alignment mark 40 corresponding to an alternative chip of the alignment chip 13 becomes the right-upper alignment mark 40A of the alternative chip and the alignment mark 40 corresponding to the alternative chip of the alignment chip 15 becomes the left-lower alignment mark 4DB of the alternative chip. In fact, the alignment mark 40 corresponding to the alternative chip is selected, keeping the positional relationships between the alignment chips 11, 13, 15 and the alignment marks 41A, 43A, 45B. This makes arithmetic processing easier when the alignment mark of the alternative chip is used.

Also, even if all of the alignment marks 41A, 43A, 45B of the alignment chips 11, 13, 15 cannot be detected about their position, the alignment method of the chips 10 could be applied to all of the alignment chips 11, 13, 15. Then, even if all of the alignment chips 11, 13, 15 are changed into the alternative chips, the alignment could be performed.

In FIG. 2A, the alignment marks 40 are on the longitudinal scribe lines 30 and are disposed to sandwich the chips 10 from both sides, but, for example, the alignment marks 40 may be formed on the transverse scribe lines 30 or on the chips 10. Various designs are possible as long as the alignment marks 40 surround the fuses 20 from the outside.

As stated above, according to the embodiment of the alignment method of the chips 10, even if the alignment marks 41A, 43A, 45B of the predetermined alignment chips 11, 13, 15 have a fault in reflection and the position of the alignment mark 41A cannot be detected, the multi-die alignment can still work and recover by selecting the alternative chips 12, 14, 18, by irradiating the corresponding alignment mark 42A, 44A, 48A with the laser light and by detecting the position from the reflected waves. This method also can prevent an increase in the alignment time caused by the failure of the multi-die alignment. Also, by selecting the alternative chips 12, 14, 18 from the chips 10 at a little more inner part than the alignment chips 11, 13, 15, good accuracy of the alignment can be kept by using chips 10 near the circumference regarding the alternative chips 12, 14, 18. Furthermore, this method allows reducing a load of control and operation because the position of the irradiation does not need to move so much.

Figure 3A:
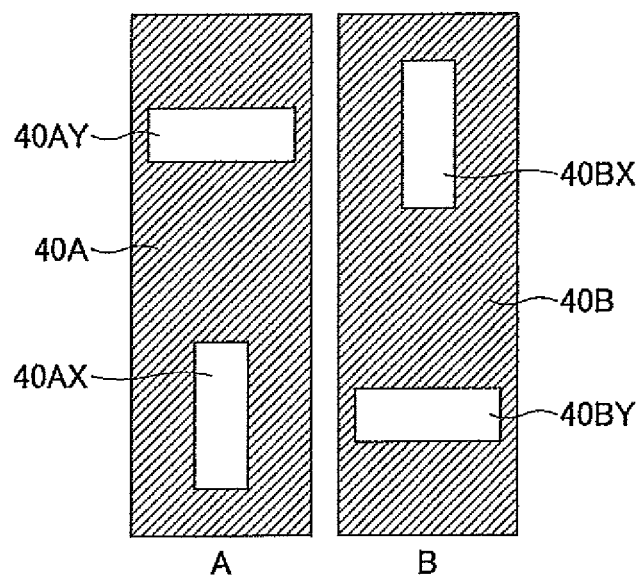
FIG. 3A is an enlarged view showing an upside alignment mark and a downside alignment mark.
Figure 3B:
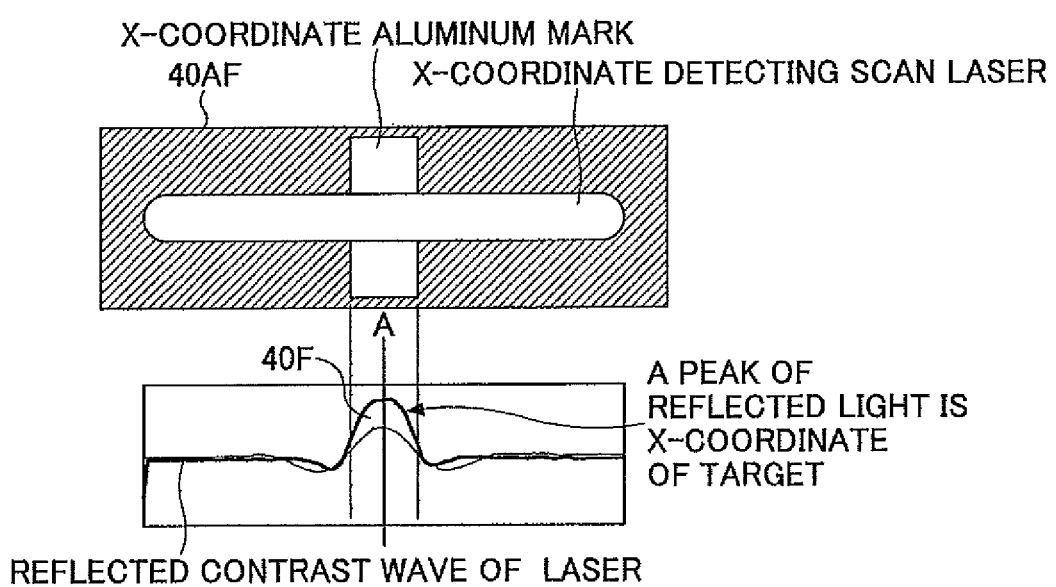
FIG. 3B is an enlarged view showing a frame format of the alignment mark for detecting the X coordinate.

Next, the detection method of the alignment marks 40 is explained with FIGS. 3A and 3B. FIGS. 3A and 3B are views for explaining a detection method of the alignment marks 40.

FIG. 3A is an enlarged view showing the upper alignment mark 40A and the lower alignment mark 40B. As shown in FIG. 3A, the alignment marks 40 include the upper alignment mark 40A and the lower alignment mark 40B which have different geometric combinations. In FIG. 3A, white portions are metal parts of the alignment marks 40A, 40B, which reflect the irradiated laser light. It is preferable for the reflected waves to be a small dot or a thin line in order to make it easier to identify the coordinate points and to ensure detection. Hence, the irradiated laser light scans each of the metal parts shown in FIG. 3A as the laser light cuts across the metal parts. More specifically, the laser light scans in a longitudinal direction (Y direction) on the upper alignment mark for detecting the Y-coordinate 40AY and the lower alignment mark for detecting the Y-coordinate 40BY. Also, the laser light scans in a transverse direction (X direction) on the upper alignment mark for detecting the X-coordinate 40AX and the lower alignment mark for detecting the Y-coordinate 40BX.

FIG. 3B is an enlarged view showing a frame format of the alignment mark for detecting the X-coordinates 40AX, 40BX. As shown in FIG. 3B, when the laser light scans in the longitudinal direction on the alignment mark for detecting the X-coordinates 40AX, 40BX, a peak of the reflected waves 40F is detected at the metal part of the alignment mark for detecting the X-coordinates 40AX, 40BX. The positions of the alignment mark for detecting the X-coordinates 40AX, 40BX are detected by detecting the peak of the reflected waves 40F. The positions can be detected more precisely if the shapes of the peak of the reflected waves 40F are not so broad. Also, even if the scan position of the laser light is displaced a little up and down, being able to detect the reflected waves is preferable. Therefore, the laser light scans while cutting across the lengthwise direction of the rectangle.

The metal part of the alignment marks 40 could be applied with various materials as long as the materials are metals with high reflectances such as aluminum.

Moreover, in FIG. 3A, the upside is the alignment mark for detecting the Y-coordinate about the upper alignment mark 40A and the downside is the alignment mark for detecting the X-coordinate about the lower alignment mark 40B so that the detection of the coordinates can be performed at the point nearer the outer shape of the chips 10.

Figure 4:
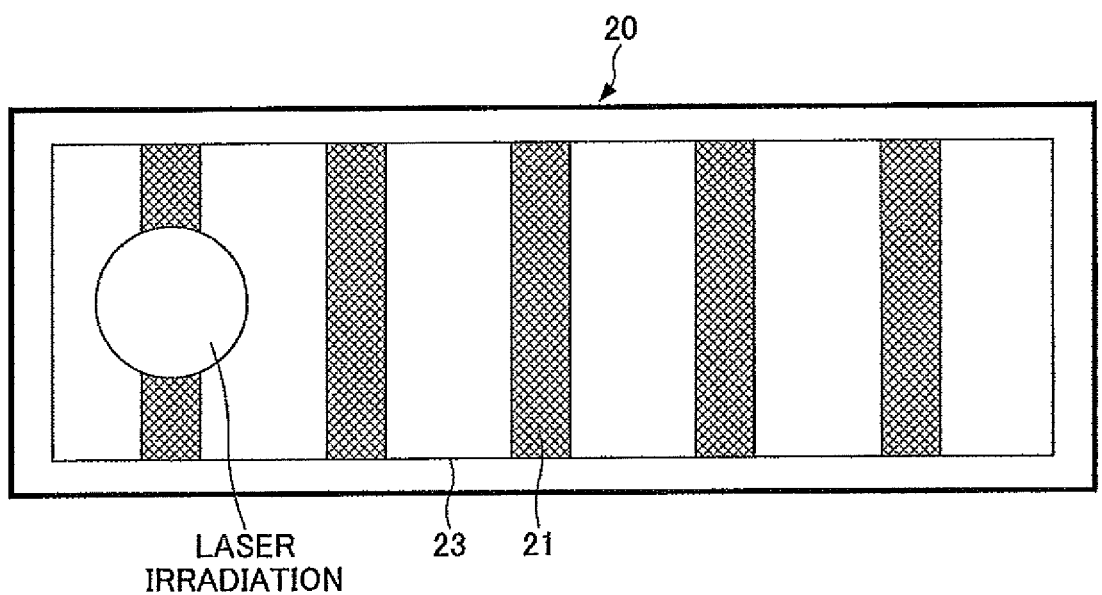
FIG. 4 is a view showing a configuration of a fuse for cutting.

Next, an embodiment of a configuration of the fuse 20 is explained with FIG. 4. FIG. 4 is a view showing an example of the configuration of the fuse 20 for cutting included in the chip 10.

In FIG. 4, cutting parts 21 are included in the fuse 20. The width of the cutting parts 21 may be, for example, in the order of microns and the length, for example, may be five or six times as long as the width. The size of the fuse 20 is much smaller than that of the chip 10. For example, the size of the fuse 20 is a minute value on the order of microns when the size of the chip 10 is 0.5 mm*0.5 mm.

Furthermore, in FIG. 4, the fuse 20 has an open window frame 23. By irradiating the cutting parts 21 of the fuse 20 through the window frame 23 with the laser light, the fuse 20 can be cut, by which an adjustment by trimming and changing a memory circuit can be performed.

In this way, the laser light is used for a cutting process of the fuse 20. Therefore, according to the embodiment of the alignment method of the chips 10, when the multi-die alignment can be certainly performed with the laser light, the time of the fuse cutting process can be very short.

Next, an application method of the embodiment of the alignment method of the chips 10 according to the position of the semiconductor wafer 60 is explained with FIG. 5A through FIG. 5E. FIG. 5A through FIG. 5E are views showing an application example of the embodiment of the alignment method of the chips 10 to different parts on the semiconductor wafer 60.

Figure 5A:
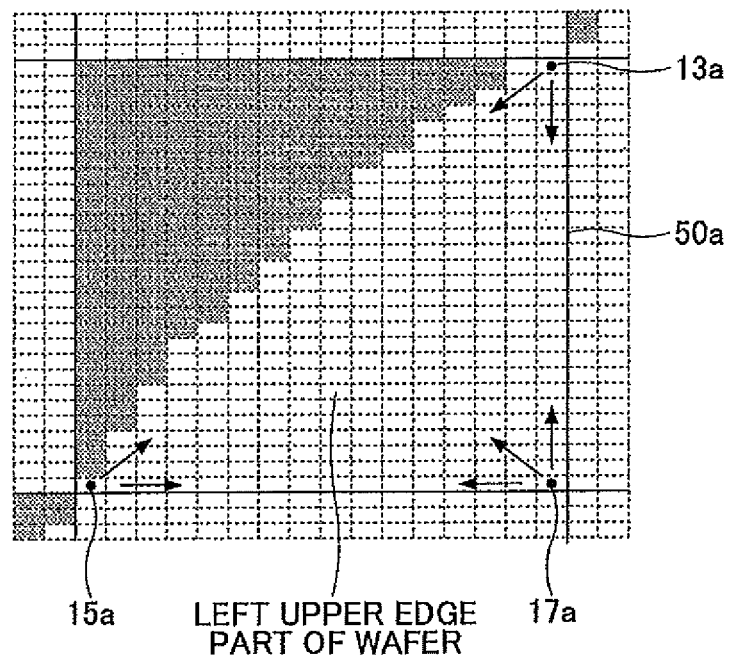
FIG. 5A is a view showing an example of an application of the embodiment of the present invention to the left-upper-edge part of a semiconductor wafer.

FIG. 5A is a view showing an application example of the embodiment of the alignment method of the chips 10 to the left-upper-edge-corner part of the semiconductor wafer 60. In FIG. 5A, when the left-upper part of the semiconductor wafer 60 is selected as a predetermined alignment area 50a, because there are no chips 11a at the left-upper corner in the predetermined alignment area 50a, the other three points are selected as the alignment chips. In FIG. 5A, the right-upper-corner chip 13a, the left-lower-corner chip 15a and the right-lower-corner chip 17a are selected as the alignment chips 13a, 15a, 17a in the predetermined area 50a. Then, the positions of the right-upper-corner chip 13a, the left-lower-corner chip 15a and the right-lower-corner chip 17a are detected by irradiating sequentially the laser light to the alignment targets 43A, 45B, 47B (not shown in the FIG. 5A, but having a similar relationship in FIG. 2A) corresponding to the alignment chips 13a, 15a, 17a. Then, when the reflected waves are not detected from the alignment targets 43A, 45B, 47B, the alternative chips are selected by shifting toward the inside. The alignment mark is changed and the detection of the reflected waves is tried again. As shown in FIG. 5A, the alternative chip can be selected from a plurality of directions. The right-upper-corner chip 13a and the left-lower-corner chip 15a facing the left-upper-edge part of the semiconductor wafer 60 can be changed toward about two directions. Candidates of the alternative chips of the right-upper-corner chip 13a and the left-lower-corner chop 15a are less than those of the right-lower-corner chip 17a which can be changed toward about three directions, but various alternative chips can still be selected from directions including chips 10.

Figure 5B:
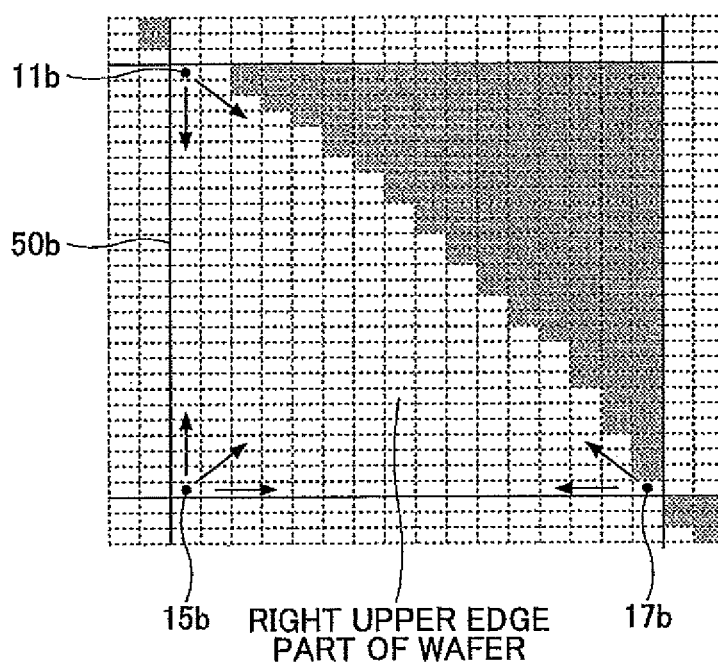
FIG. 5B is a view showing an example of an application of the embodiment of the present invention to the right-upper-edge part of the semiconductor wafer.

FIG. 5B is a view showing an application example of the embodiment of the alignment method of the chips 10 to the right-upper-edge-corner part of the semiconductor wafer 60. In FIG. 5B, when the right-upper-edge-corner part is selected as a predetermined alignment area 50b, because there are no chips 13b at the right-upper corner in the predetermined area 50b, three other points are selected as the alignment chips. In FIG. 5B, the left-upper-corner chip 11b, the left-lower-corner chip 15b and the right-lower-corner chip 17b are selected as the alignment chips 11b, 11b, 17b in the predetermined area 50b. Then, the left-upper-corner chip 11b, the left-lower-corner chip 15b and the right-lower-corner chip 17b are detected by irradiating sequentially the alignment targets 41A, 45B, 473 corresponding to the alignment chips 11b, 15b, 17b with the laser light. When the reflected waves are not detected, the alternative chip is selected from inner chips 10 and the recovery alignment is performed by irradiating the corresponding alignment target with the laser light similarly as shown in FIG. 5A. Accordingly, a detailed explanation is omitted.

Figure 5C:
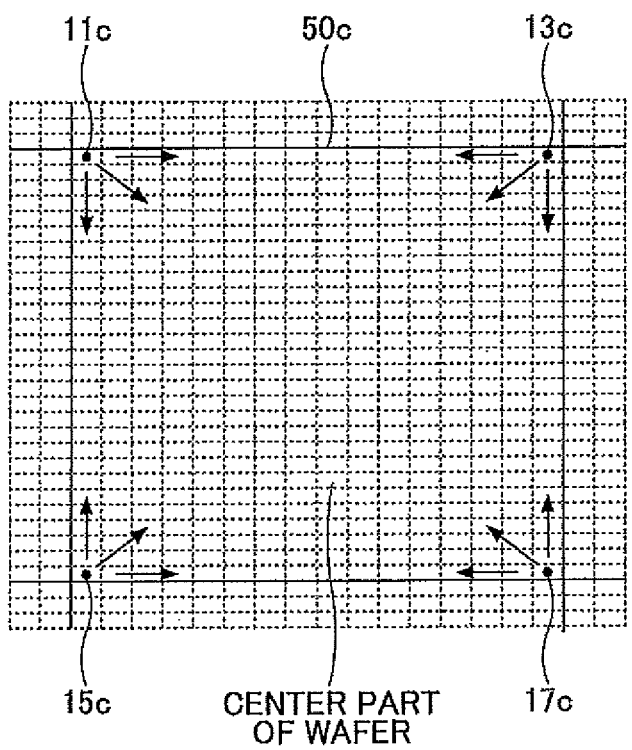
FIG. 5C is a view showing an example of an application of the embodiment of the present invention to the center part of the semiconductor wafer.

FIG. 5C is an application example of the embodiment of the alignment method of the chips 10 to the center part of the semiconductor wafer 60. In FIG. 5C, when the center part of the semiconductor wafer 60 is selected as a predetermined area 50c, the predetermined area 50c is filled with chips 10. Accordingly, any alignment chips 10 are selected from the left-upper-corner chip 11c, the right-upper-corner chip 13c, the left-lower-corner chip 15c and the right-lower-corner chip 17c. The alignment chips may be used from 1 point to 4 points according to an apparatus. When the alignment chips, for example, include the left-upper-corner chip 11c, the right-upper-corner chip 13c and the left-lower-corner chip 15c, this example of the FIG. 5C becomes almost the same example as shown in FIG. 2A except that the number of the chips 10 in the predetermined area 50c are different. Accordingly, a detailed explanation of FIG. 5C is omitted, but in the case where the center part of the semiconductor wafer 60 is the predetermined alignment area 50c, the alignment process with the most choices and high flexibility is possible.

Figure 5D:
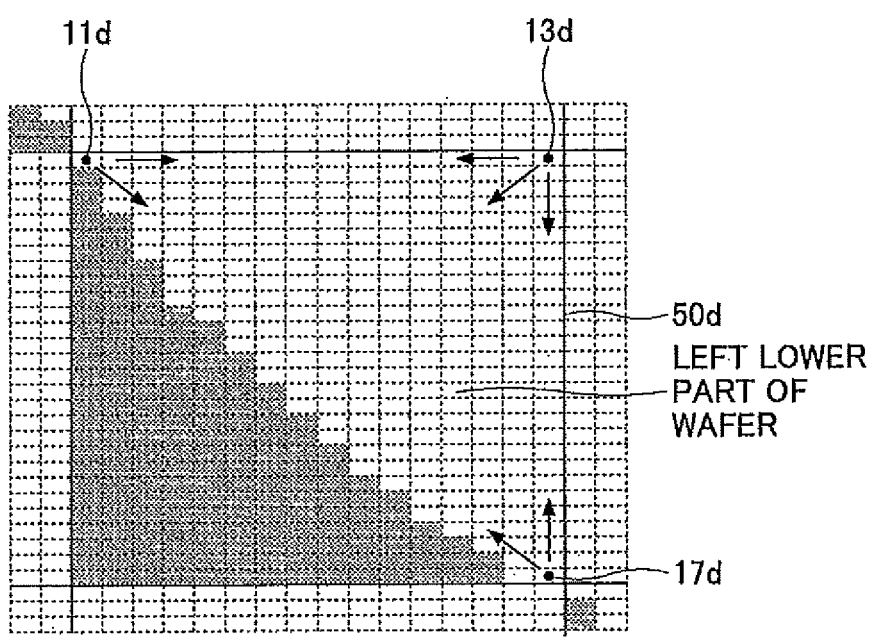
FIG. 5D is a view showing an example of an application of the embodiment of the present invention to the left-lower-edge part of the semiconductor wafer.

FIG. 5D is a view showing an application example of the embodiment of the alignment method of the chips 10 to the left-lower-edge-part of the semiconductor wafer 60. In FIG. 5D, when the left-lower-edge-corner part is selected as a predetermined alignment area 50d, because there are no chips 15d at the right-upper-corner in the predetermined area 50d, three other points are selected as the alignment chips. In FIG. 5D, the left-upper-corner chip 11d, the right-upper-corner chip 13d and the right-lower-corner chip 17d are selected as the alignment chips 11d, 13d, 17d in the predetermined area 50d. Then, the positions of the left-upper-corner chip 11d, the right-upper-corner chip 13d and the right-lower-corner chip 17d are detected by irradiating sequentially the alignment targets 41A, 43A, 47B corresponding to the alignment chips lid, 13d, 17d with the laser light. When the reflected waves are not detected from the alignment targets 41A, 43A, 47B, the alternative chip is selected from inner chips 10 and the recovery alignment is performed by irradiating the corresponding alignment target 40 with the laser light. Because this is similar to the method shown in FIG. 5A and FIG. 5B, the explanation is omitted.

Figure 5E:
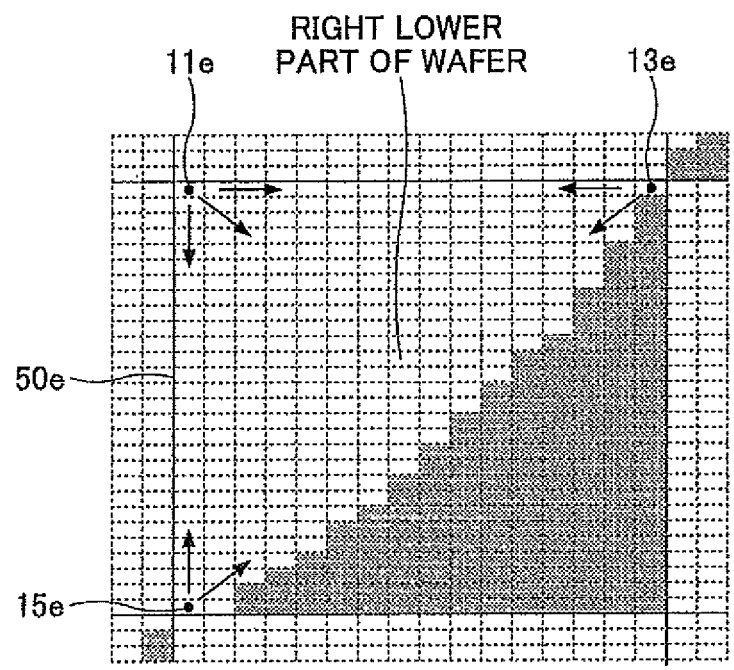
FIG. 5E is a view showing an example of an application of the embodiment of the present invention to the right-lower-edge part of the semiconductor wafer.

FIG. 5E is a view showing an application example of the embodiment of the alignment method of the chips 10 to the right-lower-edge-part of the semiconductor wafer 60. In FIG. 5E, when the left-lower-edge-corner part is selected as a predetermined alignment area 50e, because there are no chips 17e at the right-lower corner in a predetermined area 50e, other three points are selected as the alignment chips. In FIG. 5E, the left-upper-corner chip 11e, the right-upper-corner chip 13e and the left-lower-corner chip 15e are selected as the alignment chips 11e, 13e, 15e in the predetermined area 50e. Then, the positions of the left-upper-corner chip 11e, the right-upper-corner chip 13e and the left-lower-corner chip 15e are detected by irradiating sequentially the alignment targets 41A, 43A, 45DB corresponding to the alignment chips 11e, 13e, 15e with the laser light. When the reflected waves are not detected from the alignment targets 41A, 43A, 45B, the alternative chip is selected from the inside chips 10 and the recovery alignment is performed by irradiating the corresponding alignment target 40 with the laser light. Because this is similar to the method shown in FIG. 5A, 5B, and 5C, the explanation is omitted.

In FIG. 5A through FIG. 5E, the alignment chips 11b~11e, 13a, 13c~13e, 15a~15c, 15e, 17a~17d are set at the corner in the predetermined area 50a~50e. However, it is not necessary to put the alignment chips 11b~11e, 13a, 13c~13e, 15a~15c, 15e, 17a~17d at the corner of the predetermined area 50a~50e. For example, as long as the alignment chips 11b~11e, 13a, 13c~13e, 15a~15c, 15e, 17a~17d are disposed near the circumference in the alignment area 50a~50e, they may be put in position along the sides or in little inner positions from the corners. However, when the accuracy of the alignment and the ease of the arithmetical operation are considered, as shown in FIGS. 5A through 5E, it is preferable to put the alignment chips 11b~11e, 13a, 13c~13e, 15a~15c, 15e, 17a~17d at the corner in the predetermined area 50a~50e.

Figure 6:
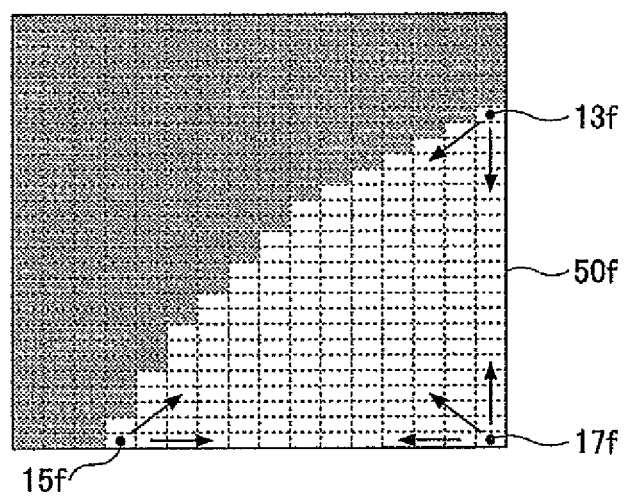
FIG. 6 is a view showing an example of an application of the embodiment of the present invention to an alignment area set at a peripheral part of the semiconductor wafer.

FIG. 6 is a view showing an application example of the embodiment of the alignment method of the chips 10 to the case where an alignment area 50f is set on the peripheral part of the semiconductor wafer 60 and only a chip 10 is at the corner in the alignment area 50f.

In FIG. 6, the chip at the corner in the alignment area 50f is only the right-lower-corner chip 17f. There are no usable chips at the other left-upper corner, right-upper corner and left-lower corner. In such a case, for example, the alignment chips 13f, 15f may be set at the edge part of the semiconductor wafer 60 and near the circumference in the alignment area 50f. This makes it possible to perform the usual multi-die alignment with three points of the alignment chips 13f, 15f, 17f. In this case, when the reflected waves cannot be detected by irradiating the alignment marks 43A, 45B, 47B of the alignment chips 13f, 15f, 17f with the laser light, the alternative chip is selected by shifting to the inside and the same process as shown in FIG. 5A is performed. Also, similar to the method shown in FIG. 5A, the alternative chip is selected from two directions where there are usable chips 10 about the alignment chip 13f, 15f and the alternative chip is selected from three directions where there are usable chips 10 about the alignment chip 17f.

In this way, even if there are no usable chips at the corner in the alignment area 50f, the proper alignment chips 13f, 15f can be selected. Moreover, even if the reflected waves are not detected from the alignment marks 43A, 45B and the positions of the alignment marks 43A, 45B are not obtained, the multi-die alignment is certainly performed by selecting the alternative chip from the usable chips 10 and by detecting the corresponding alignment mark 40.

Figure 7:
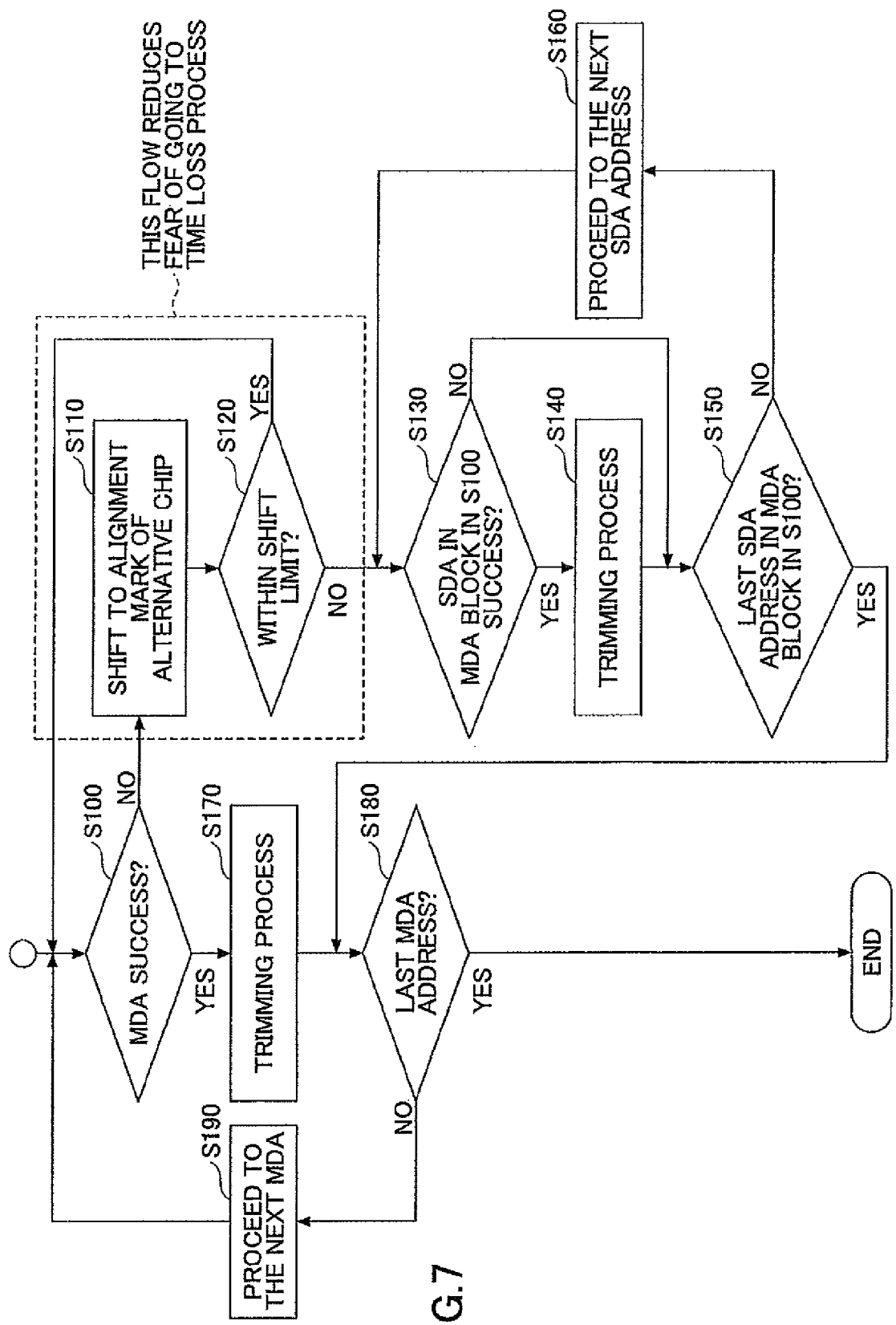
FIG. 7 is a view showing a process flow of the embodiment of the present invention.

Next, a process flow of the alignment method of the chips 10 of the embodiment is explained with FIG. 7. FIG. 7 is a view showing the process flow of the embodiment. The explanation of the process flow is given with the same reference letters as those of FIG. 2A for convenience, but the process flow can explain the embodiment of the other figures as well.

In step 100, it is determined whether the multi-die alignment (Multi-Die Alignment, MDA) succeeds or not. This may be determined by whether all reflected waves are detected from the alignment marks 41A, 43A, 45B of the alignment chips 11, 13, 15.

In step 100, if it is determined that the multi-die alignment fails, the process proceeds to step 110. If it is determined that the multi-die alignment succeeds, the process proceeds to step 170.

In step 110, a target of the irradiation with the laser light is changed from the alignment mark 41A of the alignment chip 11 to the alignment mark 42 of the alternative chip 12. When the reflected waves are not detected from the alignment mark 42A, the other alternative chips 14, 18 are sequentially selected and the target of the irradiation with the laser light is shifted to the alignment marks 44A, 48A.

In step 120, if the reflected waves are detected from the alignment marks 42A, 44A, 48A, it is determined whether the alternative chip 12 or the re-alternative chip 14, 18 are within a shift limit, a possible range of predetermined times or the predetermined area. By doing this, it is determined and confirmed whether there is concern that the accuracy of the alignment decreases because the alternative chip 12 or the other alternative chips 14, 18 go inside too much.

In step 120, if the alternative chip 12 or the other alternative chips 14, 18 are in the shift limit, the process returns to step 100. If the alternative chip 12 or the other alternative chips 14, 18 are not in the shift limit, the process proceeds to step 130.

Once again, in step 100, when it is determined that the multi-die alignment succeeds, the process proceeds to step 170.

In step 170, the alignment process is performed, and after that, a trimming process is performed and the fuses 20 are cut. This allows performing the alignment and trimming promptly and surely about the fuses 20 for trimming. A repair of a memory could be performed instead of the trimming process. This allows performing the alignment about a chip for the repair of the memory. By the trimming process, trimming of a resistance value of an analog circuit including an A/D converter or a D/A converter is performed and the analog value is adjusted. The trimming process may be a trimming of a capacitance value. Because the chip 10 including the analog circuit has a small chip size and the alignment area 50 includes many chips 10, the alignment process requires substantial time. However, when the multi-die alignment succeeds by the alignment method of the embodiment, the time for the alignment process is remarkably shortened. By doing this, for example, regarding chips including the D/A converter or the A/D converter, the alignment can be promptly and properly performed and an adjustment for the circuit can be performed.

In step 180, it is determined whether the alignment area 50 provided with the alignment process and the trimming process reaches the address of the last multi-die alignment and trimming process area on the semiconductor wafer 60.

In step 180, if it is determined that the address of the alignment area 50 reaches the last multi-die alignment address and trimming process area, the process flow ends and all the trimming process of the semiconductor wafer 60 ends. On the other hand, if it is determined that the address of the alignment area 50 does not the reach the last multi-die alignment address and trimming process area, the process advances to step 190.

In step 190, the processing target is advanced to the address of the alignment process area 50 provided with the next multi-die alignment and trimming process.

Returning to step 120, when the alignment marks 42A, 44A, 48A of the alternative chip 12 or the other alternative chips 14, 18 are not in the shift limit, in other words, in the case where the times exceed the predetermined times or the alternative chip 12 or the other alternative chips 14, 18 are not in the predetermined region, for example, in the case of it going inside too much, the process proceeds to step 130.

In step 130, it is determined whether the single-die alignment (Single-Die Alignment, SDA) succeeds in the multi-die alignment block about the predetermined alignment area 50. In other words, in step 120, when it is determined that the multi-die alignment fails without falling in the predetermined times or region, the alignment is performed by changing to the single-die alignment. The successful determination of the single-die alignment can depend on whether the reflected waves can be detected by irradiating the alignment mark 40 of each of the chips 10 with the laser light. In this case, an amount of processing increases because the position detection for the alignment shown in FIG. 2 is performed for all the chips 10. However, in the alignment method of the chips 10 of the embodiment, the alignment process is performed by the conventional single-die alignment in order to compensate functionally when the multi-die alignment cannot make an alignment recovery.

In step 130, when a success of the single-die alignment is determined, the process proceeds to step 140. The success of the single-die alignment means that each alignment succeeds about a chip 10 in the predetermined alignment area 50. On the other hand, in step 130, when it is determined that the single-die alignment succeeds, the process proceeds to step 150.

In step 140, the fuses 20 are cut by the irradiation with the laser light and the trimming process or the repair process of the memory is performed.

In step 150, it is determined whether the present objective chip 10 is the last single-die alignment address in the multi-die alignment block, the predetermined alignment area 50. This determines whether or not each of the single-die alignment is performed for all the chips 10 in the predetermined area 50.

In step 150, if it is determined that the present objective chip 10 is the last single-die alignment address in the predetermined area 50, the process will proceed to step 180. On the other hand, if it is determined that the present objective chip 10 is the last single-die alignment address in the predetermined area 50, the process will proceed to step 160.

In step 160, the objective chip 10 moves to the next address of the single-die alignment. Then, returning to step 130, the single-die alignment and the trimming process in step 140 are repeated in the predetermined area 50 and the same processes are repeated until the processes reach the last address in step 150.

In step 180, it is determined whether all the processes on the semiconductor wafer 60 are finished by the multi-die alignment, for all of the predetermined alignment areas 50. If all the processes are not finished, the process flow is repeated from the beginning. On the other hand, if all the processes are finished for all of the predetermined areas 50 on the semiconductor wafer 60, the trimming process of the semiconductor wafer 60 is finished.

In this way, according to the process flow of the embodiment of the alignment method of the chips 10, when the multi-die alignment fails in step 100, the multi-die alignment is tried again by finding the alternative chip in step 110 and step 120 without immediately shifting to the single-die alignment. Therefore, opportunities of the alignment by the multi-die alignment grow and the entire throughput improves.

Next, as a reference example for comparison, a process flow of the conventional alignment method of the chips is explained with FIG. 8. FIG. 8 is a view showing the process flow of the conventional alignment method of the chips. The same steps as the steps shown in FIG. 7 are shown by the same step numbers to make comparison and understanding easy and the explanation is omitted about the steps.

In step 100, it is determined whether the multi-die alignment succeeds. Since step 100 is the same as shown in FIG. 7, the explanation is omitted.

In step 100, if the multi-die alignment succeeds, the process proceeds to step 170. If the multi-die alignment fails, the process proceeds to step 130.

In step 130, it is determined whether the single-die alignment succeeds in the multi-die alignment block, for the predetermined alignment area 50. As stated above, in the process flow of FIG. 8, when the multi-die alignment fails in step 100, the process immediately changes to the single-die alignment. Because the single-die alignment needs the process performed in the multi-die alignment to each of the chips 10, the time for single-die alignment is hundreds of times longer than the multi-die alignment when the alignment area includes hundreds of chips 10. In general, because the time required for a chip 10 alignment process one time is about one second, the time loss corresponds to about hundreds of seconds. Due to this accumulation, the entire throughput considerably declines.

Therefore, in the process flow of the alignment method for the chips 10 of the embodiment explained in FIG. 7, even if the multi-die alignment fails one time in step 100, the recovery process of the multi-die alignment is performed in step 110 and step 120 before the single-die alignment is immediately performed in step 130. This allows the manufacturer to perform the multi-die alignment as often as possible and to reduce the time loss.

In FIG. 8, step 130 through step 160 and step 170 through step 190 are the same about their contents and orders as the process shown in FIG. 7. Accordingly, these steps are shown with the same step numbers and the explanation is omitted.

Thus, according to the embodiments of the present invention, it is possible to provide an alignment method of chips whereby a multi-die alignment can be performed about a plurality of chips in a predetermined area in a block.

The embodiments of the present invention can be applied to an alignment method of chips, the chips including a semiconductor chip formed on a semiconductor wafer and used for an integrated circuit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. An alignment method of chips that are formed on a surface of a semiconductor wafer, each of the chips having alignment marks, the method comprising the steps of:
    irradiating an alignment mark provided to a predetermined alignment chip located in a predetermined alignment area including a plurality of the chips with a laser light, said semiconductor wafer being divided into a plurality of the predetermined alignment areas;
    detecting reflected waves from the alignment mark of the predetermined alignment chip to obtain a position of the alignment mark of the predetermined alignment chip;
    irradiating an alignment mark provided to an alternative chip adjacent to the predetermined alignment chip with the laser light if the position of the alignment mark of the predetermined alignment chip is not obtained, said alternative chip being located in the predetermined alignment area to which the predetermined alignment chip belongs, a position of the alignment mark of the alternative chip relative to an entirety of the alternative chip being a same as a position of the alignment mark of the predetermined alignment chip relative to an entirety of the predetermined alignment chip;
    obtaining a position of the alignment mark of the alternative chip by detecting the reflected waves from the alignment mark of the alternative chip; and
    aligning all of the plurality of the chips in the predetermined alignment area at one time based on positions of the alignment marks of the predetermined alignment chip and the alternative chip wherein, when the reflected waves from the alignment mark of the alternative chip are not detected, the method further comprises the step of: irradiating an alignment mark of another alternative chip adjacent the predetermined alignment chip with the laser light and continuing to change the predetermined alignment chip to be irradiated by the laser light within the predetermined alignment area until the reflected waves are detected within a predetermined time or area, wherein all of the chips in the predetermined alignment area are aligned at one time based on positions of the alignment marks whose reflected waves have been detected, and the predetermined alignment chip from which the reflected waves are not detected is not used for the alignment of all of the chips in the predetermined alignment area,
    wherein each of the alignment marks provided to the chip includes a metal part, said metal part being formed of aluminum;
    wherein, said alignment mark of the alternative chip is formed of a same material as that of the predetermined alignment chip.

2. The alignment method of the chips as claimed in claim 1, wherein the predetermined alignment chip is selected from the chips near an inner circumference of the predetermined alignment area.

3. The alignment method of the chips as claimed in claim 1, wherein, the alternative chip is selected from the chips more inward than the predetermined alignment chip.

4. The alignment method of the chips as claimed in claim 1, wherein each of the chips has a fuse for cutting and the alignment mark is provided at more outer part than the fuse.

5. The alignment method of the chips as claimed in claim 1, wherein the alignment marks are provided in a scribe line formed between chips.

6. The alignment method of the chips as claimed in claim 4, wherein, each of the chips has an analog circuit having an analog value that is adjusted by cutting the fuse.

7. The alignment method of the chips as claimed in claim 4, wherein the fuse is for a trimming of a resistance.

8. The alignment method of the chips as claimed in claim 4, wherein, the fuse is for changing a circuit to another circuit thereby repairing a memory.

9. The alignment method of the chips as claimed in claim 1, wherein, the predetermined alignment area includes a plurality of the alignment chips.

10. The alignment method of the chips as claimed in claim 1, wherein the irradiation step is repeatedly performed to another alignment chip in the predetermined alignment area until the reflected waves are detected from the another alignment chip so as to align the all of the plurality of the chips in the predetermined alignment area at one time.

11. The alignment method of the chips as claimed in claim 1, further comprising a step of forming a fuse on the each of the chips before the irradiating the alignment mark of the predetermined alignment chip.

12. The alignment method of the chips as claimed in, claim 1, wherein each of three corners of the predetermined area has the predetermined alignment chip, and
    all of the chips in the predetermined alignment area are aligned at one time by detecting the reflected waves from the alignment chips, each of which being a closest alignment chip to each of the corners of the predetermined area among the alignment chips which have been irradiated.

13. The alignment method of the chips as claimed in claim 1, wherein the irradiation is not performed more than once to any one of the chips.